US012588563B2

(12) United States Patent
Chen et al.

(10) Patent No.: US 12,588,563 B2
(45) Date of Patent: Mar. 24, 2026

(54) ELECTRONIC DEVICE AND FABRICATION METHOD THEREOF

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 385 days.

(21) Appl. No.: 18/136,352

(22) Filed: Apr. 19, 2023

(65) Prior Publication Data

US 2023/0411372 A1 Dec. 21, 2023

(30) Foreign Application Priority Data

May 26, 2022 (CN) .......................... 202210586892.2

(51) Int. Cl.
*H01L 25/16* (2023.01)
*H10D 86/40* (2025.01)
*H10D 86/60* (2025.01)

(52) U.S. Cl.
CPC ......... *H01L 25/167* (2013.01); *H10D 86/423* (2025.01); *H10D 86/60* (2025.01)

(58) Field of Classification Search
CPC ....... H01L 25/167; H01L 25/16; H01L 25/18; H01L 25/0753; H10D 86/423; H10D 86/40; H10D 86/60
See application file for complete search history.

(56) References Cited

U.S. PATENT DOCUMENTS

| | | | | |
|---|---|---|---|---|
| 11,127,343 | B2 * | 9/2021 | Jeong | H10H 20/83 |
| 11,978,398 | B2 * | 5/2024 | Hong | H10K 59/353 |
| 2020/0273397 | A1 * | 8/2020 | Jeong | G09G 3/32 |
| 2023/0215357 | A1 * | 7/2023 | Hong | H10K 59/40 |
| | | | | 345/174 |

FOREIGN PATENT DOCUMENTS

TW 202202994 A 1/2022

* cited by examiner

*Primary Examiner* — Nikolay K Yushin
(74) *Attorney, Agent, or Firm* — Winston Hsu

(57) ABSTRACT

An electronic device includes a substrate, a transistor disposed on the substrate, an electrode disposed on the substrate and coupled to the transistor, and a plurality of electronic units disposed on the substrate and coupled to the electrode. The transistor is used to align the plurality of electronic units when the plurality of electronic units are in an alignment mode, and the transistor is turned off when the plurality of electronic units are in an operating mode.

9 Claims, 16 Drawing Sheets

306

Y

X

Z

ELECTRONIC DEVICE AND FABRICATION METHOD THEREOF

BACKGROUND OF THE DISCLOSURE

1. Field of the Disclosure

The present disclosure is related to display panel technology, and more particularly to an electronic device capable of aligning each pixel independently and the fabricating method thereof.

2. Description of the Prior Art

Micro light-emitting diode (micro LED) displays have been widely adapted in various electronic products. A micro LED display contains many micro LED chips. To make the micro LED chips emit light, the two terminals of the micro LED chips must receive P/N signals from two electrodes respectively. Therefore, when fabricating a micro LED display, all the micro LED chips are arranged in an orderly manner such that the two terminals of each micro LED chip are respectively coupled to two electrodes. This procedure is called an alignment process.

The current alignment process adapts a method called stamping to transfer and attaches the micro LED chips to the electrodes. However, stamping is imprecise and likely to cause abnormalities in the LED display.

SUMMARY OF THE DISCLOSURE

An embodiment provides an electronic device including a substrate, a first transistor disposed on the substrate, a first electrode disposed on the substrate and coupled to the first transistor, and a plurality of first electronic units disposed on the substrate and coupled to the first electrode. The first transistor is used to align the plurality of first electronic units when the plurality of first electronic units are in an alignment mode, and the first transistor is turned off when the plurality of first electronic units are in an operating mode.

An embodiment provides a method of fabricating an electronic device. The method includes providing a substrate, forming a first transistor on the substrate, forming a first electrode pair on the substrate wherein a first electrode of the first electrode pair is coupled to the first transistor, disposing a plurality of first electronic units on the substrate, aligning the plurality of first electronic units by applying a first voltage to the first electrode and applying a second voltage to a second electrode of the first electrode pair through the first transistor, and insulating the first electrode from the first transistor after aligning the plurality of first electronic units.

These and other objectives of the present disclosure will no doubt become obvious to those of ordinary skill in the art after reading the following detailed description of the embodiment that is illustrated in the various figures and drawings.

DETAILED DESCRIPTION

Figure 1:
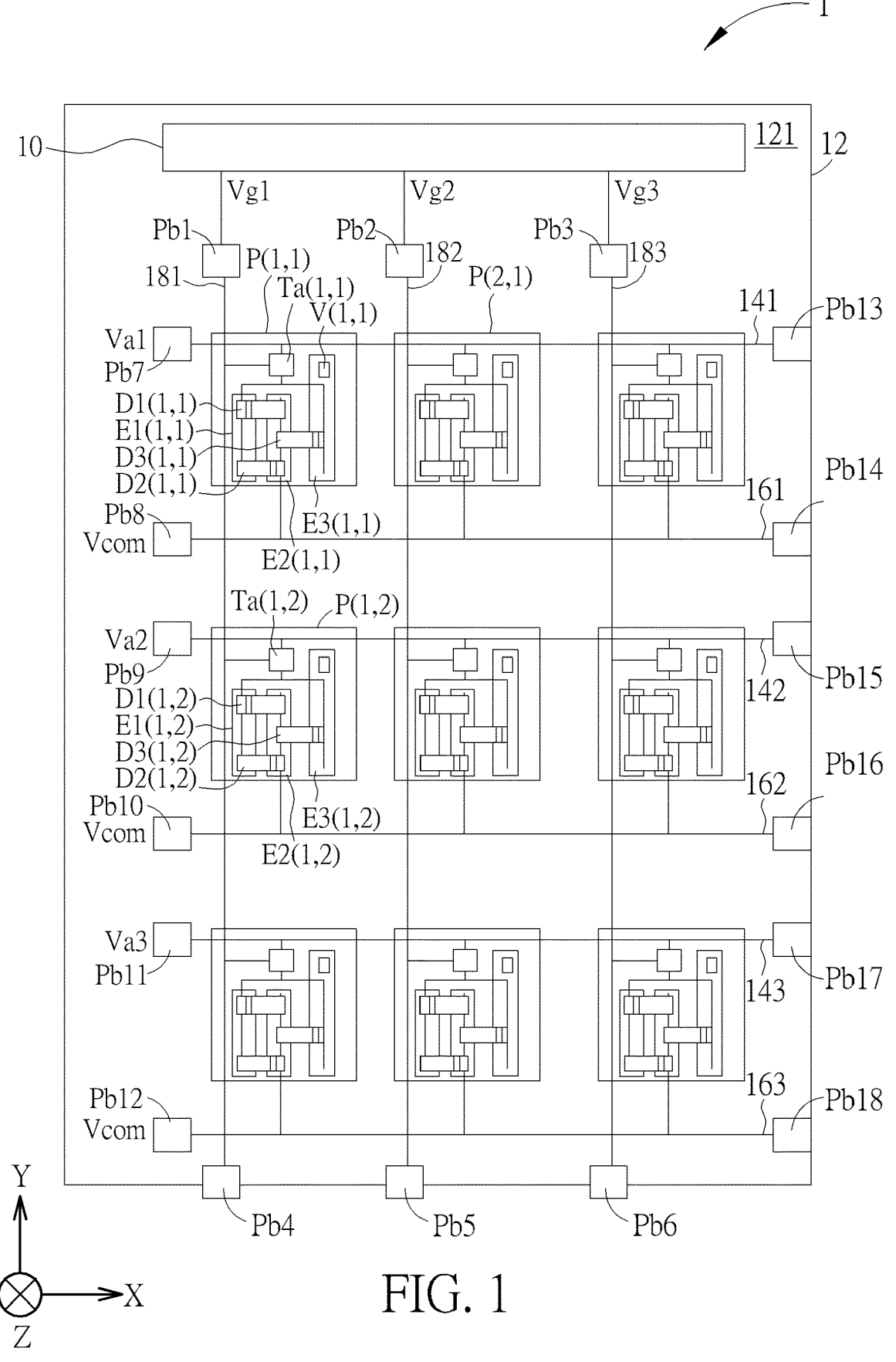
FIG. 1 is a layout diagram of an electronic device of an embodiment of the present disclosure.

The present disclosure may be understood by reference to the following detailed description, taken in conjunction with the drawings as described below, and for purposes of illustrative clarity and being easily understood by the readers, various drawings of this disclosure may be simplified, and the elements in various drawings may not be drawn to scale. In addition, the number and dimension of each element shown in drawings are just illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "comprise", "include" and "have" are used in an open-ended fashion, and thus should be interpreted to mean "include, but not limited to . . . ".

The direction terms used in the following embodiment such as up, down, left, right, in front of or behind are just the directions referring to the attached figures. Thus, the direction terms used in the present disclosure are for illustration, and are not intended to limit the scope of the present disclosure. It should be noted that the elements which are specifically described or labeled may exist in various forms for those skilled in the art. Besides, when a layer is referred to as being "on" another layer or substrate, it may be directly on the other layer or substrate, or may be on the other layer or substrate, or intervening layers may be included between other layers or substrates.

Besides, relative terms such as "lower" or "bottom", and "higher" or "top" may be used in embodiments to describe the relative relation of an element to another element labeled in figures. It should be understood that if the labeled device is flipped upside down, the element in the "lower" side may be the element in the "higher" side.

The ordinal numbers such as "first", "second", etc. are used in the specification and claims to modify the elements in the claims. It does not mean that the required element has any previous ordinal number, and it does not represent the order of a required element and another required element or the order in the manufacturing method. The ordinal number is just used to distinguish the required element with a certain name and another required element with the same certain name.

The term "substantially" is generally interpreted as being within 20% of a given value or range, or as being within 10%, 5%, 30, 20, 10 or 0.50.

It should be noted that the technical features in different embodiments described in the following may be replaced, recombined, or mixed with one another to constitute another embodiment without departing from the spirit of the present disclosure.

In the present disclosure, the electronic device may include a display panel, an antenna device, a sensing device, a tiled device, or a transparent display device, but is not limited thereto. The light emitting diodes may include organic light emitting diodes (OLEDs), mini LEDs, micro LEDs or quantum dot LEDs, but is not limited thereto. The electronic device may include a rollable, stretchable, bendable, or flexible electronic device.

FIG. 1 is a layout diagram of an electronic device 1 of an embodiment of the present disclosure. The electronic device 1 includes a plurality of pixels for displaying images. Each pixel can have an independent alignment electrode and an independent alignment transistor. The electronic device 1 can use independent alignment electrodes and independent alignment transistors to align each pixel independently by using fluid transfer or inkjet transfer with other alignment processes to ensure each pixel operating normally.

The electronic device 1 may further include bonding electrodes Pb1 to Pb18, a control chip 10 and a substrate 12. The bonding electrodes Pb1-Pb18 and the control chip 10 can be disposed on the front surface 121 of the substrate 12. A plurality of pixels can be disposed in an array on the front surface 121 of the substrate 12. The plurality of pixels can be coupled to the control chip 10 via the signal lines 181, 182 and 183 and the bonding electrodes Pb1, Pb2 and Pb3, and coupled to the ground terminal via the signal lines 161, 162 and 163 and the bonding electrodes Pb8, Pb10 and Pb12. The ground terminal can provide a common voltage Vcom, such as 0V or a voltage lower than VDD. The signal lines 141, 142 and 143 and the bonding electrodes Pb7, Pb9 and Pb11 may be floating or coupled to the control chip 10. Although FIG. 1 only shows 9 pixels, persons with ordinary skill in the art can configure other numbers of pixels in the electronic device 1 according to various implementations. In addition, the shapes of the substrate 12 and the pixel array are not limited to square, but can be other regular shapes or irregular shapes.

During the alignment process, the external control circuit can transmit the voltage signals Vg1, Vg2 and Vg3 through the signal lines 181, 182 and 183 and can transmit the alignment voltages Va1-Va3 through the signal lines 141, 142 and 143 to the corresponding pixels, so as to align multiple pixels. When using an electronic device, the control chip 10 can transmit voltage signals Vg1, Vg2 and Vg3 to corresponding pixels through the signal lines 181, 182 and 183 to drive multiple pixels for displaying images. The electronic device 10 includes operating mode and non-operating mode. In the operating mode, multiple pixels perform actions such as emitting light, sensing and/or sending and receiving signals; in the non-operating mode, multiple pixels would not perform the above actions (such as emitting light, sensing and/or sending and receiving signals) and would be reset.

The structures of the pixels are similar. For this reason, only the pixel P(1, 1) is explained in detail here. The pixel P(1, 1) can include an alignment transistor Ta(1, 1), a set of electrodes, electronic units D1(1, 1)-D3(1, 1), and a driving circuit. The set of electrodes may include electrodes E1(1, 1)-E3(1, 1). The electronic units D1(1, 1)-D3(1, 1) may include a plurality of light emitting units. The electronic units D1(1, 1)-D3(1, 1) may be a rod-shaped light emitting units. The rod-shaped light-emitting unit can be strip-shaped, and two electrodes can be disposed on both sides of the rod-shaped light-emitting unit. The electronic units D1(1, 1)-D3(1, 1) can be micro LEDs, sensing diodes, or varactors. The driving circuit mainly provides the driving signals to the electronic units. Although only three electrodes and three electronic units are shown in each pixel in FIG. 1, those skilled in the art can configure other numbers of electrodes and electronic units according to the implementation.

The alignment transistor Ta(1, 1), the electrodes E1(1, 1)-E3(1, 1) and the electronic units D1(1, 1), D2(1, 1) and D3(1, 1) can be disposed on the substrate 12. The alignment transistor Ta(1, 1) can be coupled to the signal line 181, the signal line 141, the electrode E1(1, 1) and the electrode E3(1, 1). The electrode E2(1, 1) can be coupled to the signal line 161. The electrode E2(1, 1) can be disposed between the electrode E1(1, 1) and the electrode E3(1, 1). The arrangement helps to form electric fields between the electrode E1(1, 1) and the electrode E2(1, 1) and between the electrode E2(1, 1) and the electrode E3(1, 1). During the alignment process, the solvent with the electronic units D1(1, 1)-D3(1, 1) can be transferred to the pixel P(1, 1) through fluid transfer or inkjet transfer. At this time the electronic units D1(1, 1)-D3(1, 1) are in a disordered state. In the alignment mode of the electronic units D1(1, 1)-D3(1, 1), the external control circuit can turn on the alignment transistor Ta(1, 1) to align the electrodes E1(1, 1) and E2 (1, 1) and to generate an electric field between the electrode E2 (1, 1) and the electrode E3(1, 1). Hence, the electronic units D1(1, 1)-D3(1, 1) spin between the electrode E1(1, 1) and the electrode E2 (1, 1) until they become parallel to the direction of the electric field; the electronic units D1(1, 1)-D3(1, 1) spin between the electrodes E2(1, 1) and E3(1, 1) until they become parallel to the direction of the electric field. As the result, the electronic units D1(1, 1)-D3 (1, 1) can be properly aligned in an orderly configuration. When aligned, the electronic units D1(1, 1)-D3(1, 1) are substantially disposed in the same direction. For example, they are substantially disposed in X direction and can be slightly inclined, and the two terminals the electronic unit D1(1, 1) and the two terminals of the electronic unit D2 (1, 1) can be respectively coupled to the electrode E1(1, 1) and the electrode E2(1, 1); the two terminals of the electronic unit D3 (1, 1) can be respectively coupled to the electrode E2 (1, 1) and electrode E3 (1, 1). The PN polarities of the corresponding terminals of the electronic units D1(1, 1) and D2 (1, 1) coupled to the electrode E1 (1, 1) can be the same or different. The PN polarities of the corresponding terminals of the electronic units D1(1, 1) and D3(1, 1) coupled to the electrode E2(1, 1) may be the same or different. For example, the corresponding terminal of the electronic unit D1(1, 1) coupled to the electrode E1(1, 1) may have P polarity, and the corresponding terminal of the electronic unit D2 (1, 1) coupled to the electrode E1 (1, 1) may have N polarity. During the operating mode of the electronic units D1 (1, 1)-D3 (1, 1), the control chip 10 can turn off the alignment transistor Ta(1, 1) to drive the electronic units D1(1, 1)-D3(1, 1).

Figure 2:
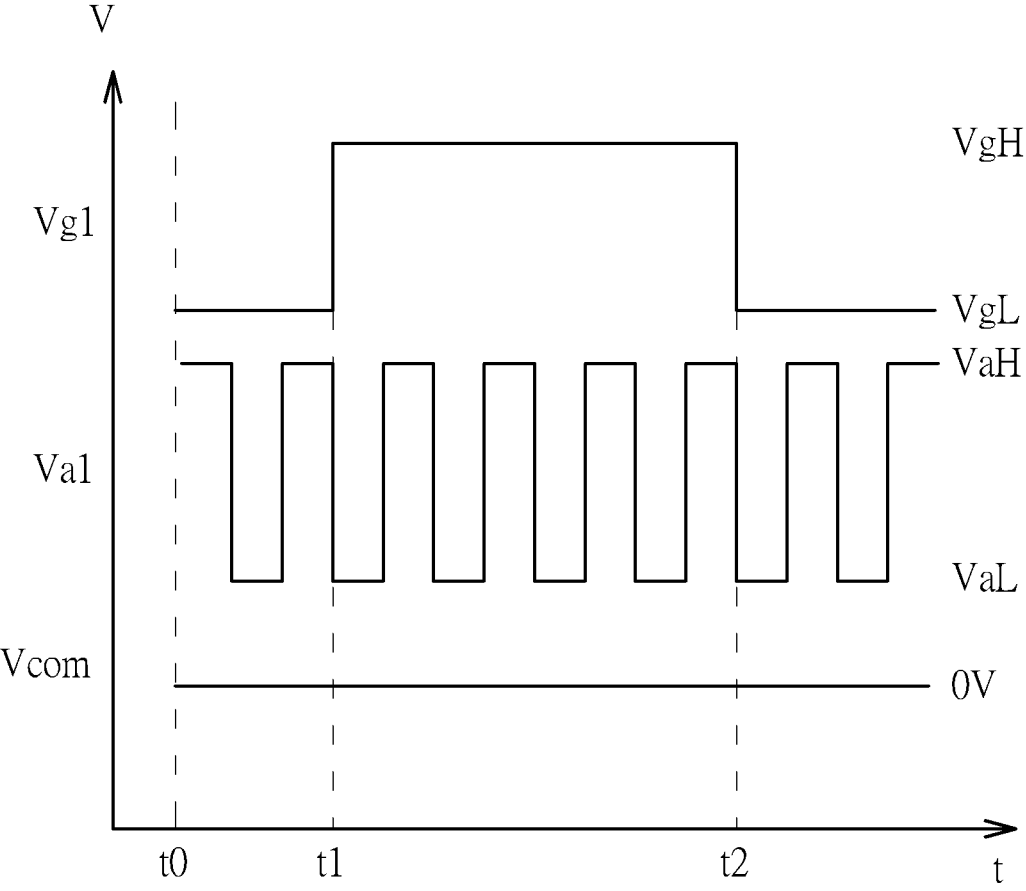
FIG. 2 illustrates the waveforms of the pixels in FIG. 1 in alignment mode.

In some embodiments, in the alignment mode of the electronic units D1(1, 1)-D3(1, 1), the external control circuit can apply a voltage signal Vg1 to turn on the alignment transistor Ta (1, 1), and apply the alignment voltage Va1 to generate the electric field between the electrodes E1 (1, 1) and E2 (1, 1) and the electric field between the electrodes E2(1, 1) and E3(1, 1). FIG. 2 illustrates a waveform diagram of the alignment mode of the pixel P(1, 1). The horizontal axis represents the time t, and the vertical axis represents the voltage V. Between time t0 and t1, the alignment mode has not yet started, and the external control circuit sets the voltage signal Vg1 to the voltage level VgL to turn off the alignment transistor Ta (1, 1). The voltage level VgL is lower than the critical voltage of the alignment transistor Ta(1, 1). For example, the voltage level VgL may be −10V. Between time t1 and t2, the external control circuit sets the voltage signal Vg1 to the voltage level VgH, and the alignment voltage Va1 oscillates between the voltage level VaH and the voltage level VaL. The common voltage Vcom is maintained at 0V or below VDD. The voltage level VgH exceeds the critical voltage of the alignment transistor Ta (1, 1). For example, the voltage level VgH can be 10V, 20V or 30V. The voltage level VaH can be a positive voltage, such as 30V. The voltage level VaH can be a negative voltage, such as −30V. When the common voltage Vcom is maintained at a fixed voltage level and the alignment voltage Va1 oscillates back and forth between the voltage level VaH and the voltage level VaL, an electric field can be formed between the electrode E2 (1, 1) and the electrode E3 (1, 1) and between the electrode E1 (1, 1) and the electrode E2 (1, 1). Thus, the electronic units D1(1, 1)-D3(1, 1) can be aligned. In some embodiments, the alignment voltage Va1 can be fixed at the voltage level VaH or the voltage level VaL such that the electric field can be formed between the electrode E2 (1, 1) and the electrode E3(1, 1) and between the electrode E1 (1, 1) and the electrode E2 (1, 1). Thus, the electronic units D1 (1, 1)-D3 (1, 1) can be aligned. In other words, when the electronic unit is affected by the electric field, the electronic unit is considered to be in alignment mode. After time t2, the alignment mode is completed, and the external control circuit sets the voltage signal Vg1 to the voltage level VgL to turn off the alignment transistor Ta(1, 1).

Referring to FIG. 1, the contact via V(1, 1) is used to connect to the electrode E3(1, 1) and the driving circuit of the pixel P(1, 1). The aligned electronic units D1(1, 1)-D3 (1, 1) can be set to operating mode or non-operating mode to display images. In the non-operating mode, the control chip 10 can reset the electronic units D1 (1, 1)-D3 (1, 1). In the operating mode, the control chip 10 can apply a control signal to the driving circuit of the pixel P(1, 1), and the driving circuit of the pixel P(1, 1) can drive the electronic units D1(1, 1)-D3(1, 1) through the electrode E3(1, 1) and the electrode E1(1, 1). Therefore, in both alignment mode and operating mode, the electronic units D1 (1, 1)-D3 (1, 1) can share the electrodes E1(1, 1)-E3(1, 1), which improves component utilization and reduces circuit area. At the same time, in the operating mode, the control chip 10 can turn off the alignment transistor Ta(1, 1) so that the driving signal is not affected by the alignment signal (i.e., the alignment voltage Va1), thus improving the signal quality of the driving signal. For example, during the operating mode, the control chip 10 can set the voltage signal Vg1 to the voltage level VgL and set the alignment voltage Va1 to floating or 0V; the common voltage Vcom can be maintained at 0V or lower than VDD so as to turn off the alignment transistor Ta(1, 1).

Figure 3:
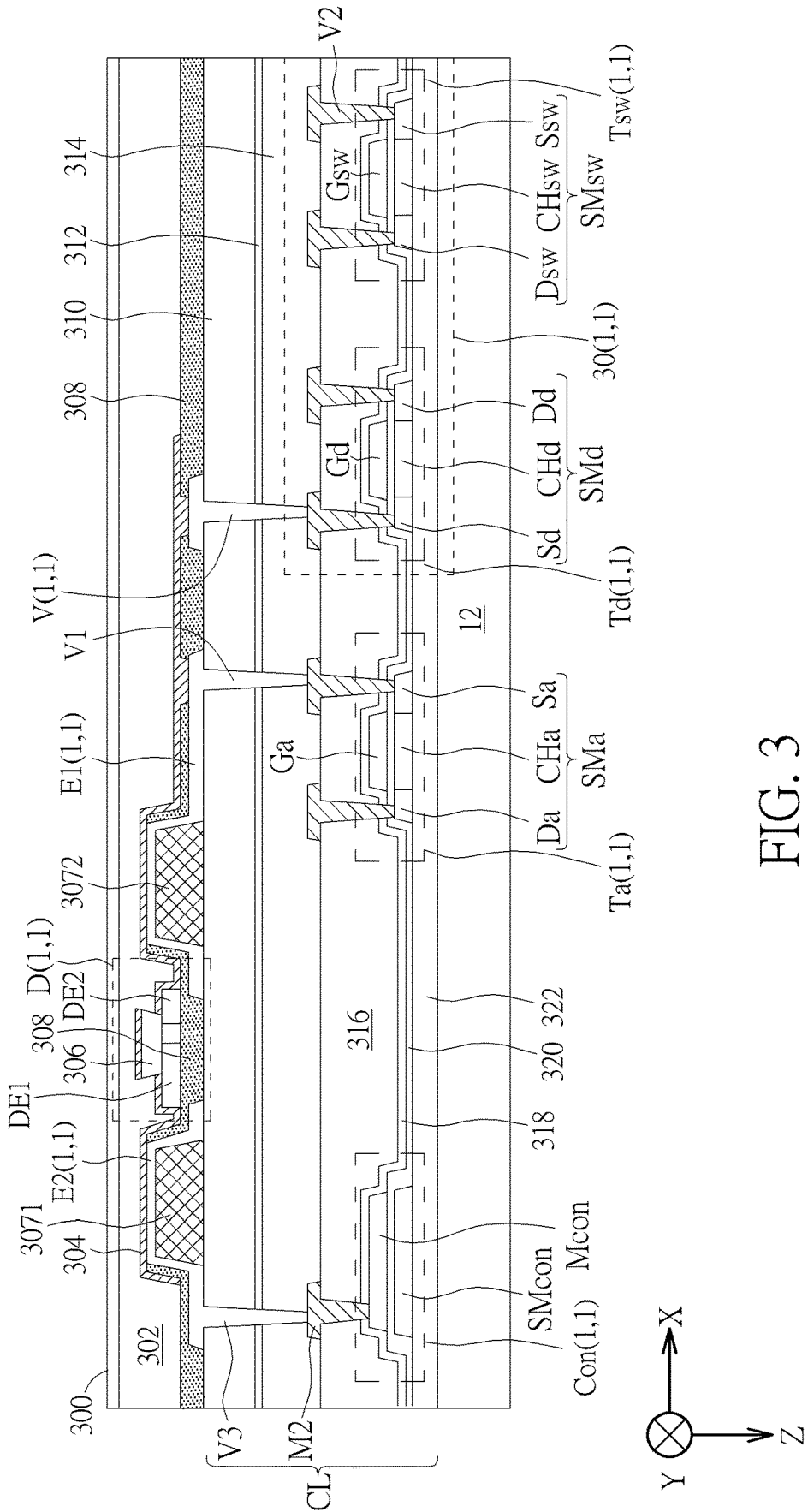
FIG. 3 is a cross-sectional view of a pixel in FIG. 1.

FIG. 3 is a diagram of the cross-sectional view of the pixel P(1, 1). The pixel P(1, 1) may include an alignment transistor Ta(1, 1), an electrode E1(1, 1) and a set of electrodes E2(1, 1), an electronic unit D(1, 1) and a driving circuit 30(1, 1). The driving circuit 30(1, 1) may include a driving transistor Td(1, 1) and a switching transistor Tsw(1, 1). The electronic unit D(1, 1) of FIG. 3 may correspond to one of the electronic units D1(1, 1)-D3(1, 1) in FIG. 1. The electronic device 1 may further include an insulation layer 300, an insulation layer 302, a contact electrode layer 304, an insulation layer 306, pixel defining layers (PDL) 3071 and 3072, insulation layers 308-318, a gate insulator (GI) layer 320, a buffer layer 322, the connection device Con(1, 1), the contact vias V1, V2 and V3 and the metal layer M2. The above-mentioned components form the structure of the pixel P(1, 1). The stacks 308-322 can form a circuit layer CL. The insulation layers 300, 308, 312, and 318 may be formed with inorganic materials, such as silicon oxide (SiOx) or silicon nitride (SiNx). The insulation layers 302, 306, 310, 314 and 316 may be formed with organic materials. The contact electrode layer 304 may be formed with a transparent electrode layer, such as indium tin oxide (ITO), indium zinc oxide (IZO) or indium zinc tin oxide (IZTO).

The alignment transistor Ta(1, 1) may include a gate Ga and a semiconductor layer SMa. The semiconductor layer SMa may include a drain region Da, a source region Sa, and a channel region CHa. The alignment transistor Ta(1, 1) may further include oxide semiconductor, such as zinc oxide (ZnO), cadmium oxide (CdO), indium gallium zinc oxide (IGZO), or other oxide semiconductors. The driving transistor Td(1, 1) may include a gate Gd and a semiconductor layer SMd. The semiconductor layer SMd may include a drain region Dd, a source region Sd and a channel region CHd. The switching transistor Td(1, 1) may include a gate Gsw and a semiconductor layer SMsw. The semiconductor layer SMsw may include a drain region Dsw, a source region Ssw and a channel region CHsw. The connection device Con(1, 1) may include a metal layer Mcon and a semiconductor layer SMcon for receiving the common voltage Vcom.

The buffer layer 322 can be disposed on the substrate 12. The semiconductor layer SMsw of the switching transistor Tsw(1, 1) can be disposed on the buffer layer 322. The channel region CHsw can be disposed between the drain region Dsw and the source region Ssw. The gate insulator layer 320 can be disposed on the buffer layer 322 and the semiconductor layer SMsw of the switching transistor Tsw (1, 1). The gate Gsw of the switching transistor Tsw(1, 1) can be disposed on the gate insulator layer 320, and the insulation layer 318 can be disposed on the gate Gsw. The insulation layer 316 can be disposed on the insulation layer 318, and the metal layer M2 can be disposed on the insulation layer 316. The contact via V2 can penetrate through the insulation layer 316, the insulation layer 318 and the gate insulator layer 320, so as to contact the metal layer M2, the drain region Dsw or the source region Ssw. The structure and arrangement of the alignment transistor Ta(1, 1) and the driving transistor Td(1, 1) are similar to the switching transistor Tsw(1, 1). The details are not repeated here for the sake of brevity.

The insulation layer 314 can be disposed on the insulation layer 316 and the metal layer M2. The insulation layer 312 can be disposed on the insulation layer 314. The insulation layer 310 can be disposed on the insulation layer 312. The electrode E1 (1, 1) and the electrode E2 (1, 1) can be disposed on the insulation layer 310. The contact via V(1, 1) can penetrate through the insulation layer 310, 312 and 314, so as to contact the metal layer M2. The contact via V1 can penetrate through the insulation layers 3310, 312 and 314, so as to contact the metal layer M2 and the electrode E1 (1, 1). The contact via hole V3 can penetrate the insulation layers 310, 312 and 314, so as to contact the metal layer M2 and the electrode E2(1, 1). The conduction layer 307 can be disposed on the electrode E1(1, 1) and the contact via V(1, 1). The insulation layer 308 can be disposed on the electrode E1 (1, 1), the electrode E2 (1, 1) and the insulation layer 310. An opening can be formed between the pixel defining layers 3071 and 3072, and the electronic unit D(1, 1) may be disposed in the opening. After the alignment process is completed, the electronic unit D(1, 1) is disposed at the desired position of alignment, and the insulation layer 306 can be partially disposed on a specific area of the electronic unit D(1, 1), such as the middle area. As such, the terminal regions DE1 and DE2 of the electronic unit D(1, 1) are exposed for use, and the electrode E1 (1, 1) would have less deviation of from the desired position of alignment. The contact electrode layer 304 can cover the insulation layer 308, the electrode E2(1, 1), the terminal regions DE1 and DE2, the insulation layer 306, the electrode E1(1, 1) and the conduction layer 307. Since the contact electrode layer 304 covers the terminal regions DE1 and DE2 of the electronic unit D(1, 1), the chance for a short circuit defect occurs between the terminal regions DE1 and DE2 can be effectively reduced. The insulation layer 302 can be disposed on the insulation layer 308 and the contact electrode layer 304, and the insulation layer 300 can be disposed on the insulation layer 302.

The source region Sa of the alignment transistor Ta(1, 1) can be coupled to the electrode E1(1, 1) through the contact via V2, the metal layer M2, and the contact via V1. The electrode E2(1, 1) can be coupled to the ground through the contact via V3, the metal layer M2, the contact via V1, metal layer Mcon and the semiconductor layer SMcon. In the alignment mode, the alignment transistor Ta(1, 1) can be turned on to generate the electric field between the electrodes E1(1, 1) and E2(1, 1) to align the electronic unit D(1, 1). The source region Sd of the driving transistor Td(1, 1) can be coupled to the electrode E1 (1) through the contact via V2, the metal layer M2, the contact via V(1, 1), the conductive layer 307 and the contact electrode layer 304. During the operating mode, the driving transistor Td(1, 1) can be turned on to allow the current to pass through the electrode E1(1, 1), the electronic unit D(1, 1) and the electrode E2(1, 1) in order to drive the electronic unit D(1, 1).

Figure 4:
FIG. 4 is a circuit diagram of a pixel in FIG. 1.
Figure 4:
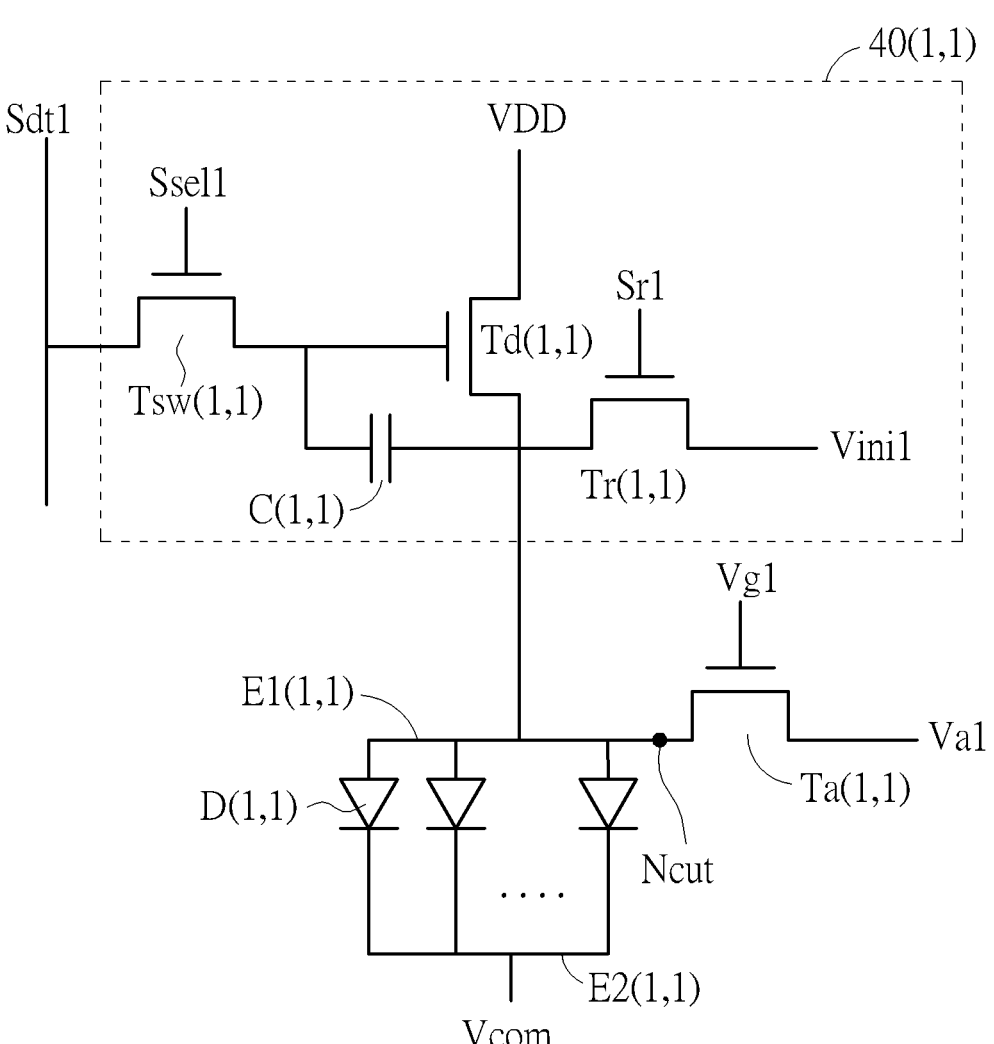

FIG. 4 is a circuit diagram of the pixel P(1, 1). The pixel P(1, 1) includes a driving circuit 40(1, 1), an alignment transistor Ta(1, 1), an electrode E1 (1, 1), an electrode E2(1, 1) and a plurality of electronic units D(1, 1). The plurality of electronic units D(1, 1) may correspond to the electronic units D1(1, 1)-D3(1, 1) in FIG. 1. The driving circuit 40(1, 1) may include a switching transistor Tsw(1, 1), a driving transistor Td(1, 1), a reset transistor Tr(1, 1) and a capacitor C(1, 1). The switching transistor Tsw(1, 1) may include a control terminal for receiving the signal Ssel1, a first terminal for receiving the signal Sdt1, and a second terminal. The driving transistor Td(1, 1) may include a control terminal coupled to the second terminal of the switching transistor Tsw(1, 1), a first terminal for receiving the voltage VDD, and a second terminal coupled to the electrode E1 (1, 1). The reset transistor Tr(1, 1) may include a control terminal for receiving the signal Sr1, a first terminal coupled to the second terminal of the driving transistor Td(1, 1), and a second terminal for receiving the signal Vini1. The signal Vini1 can be set to a low voltage level. The capacitor C(1, 1) may include a first terminal coupled to the second terminal of the switching transistor Tsw(1, 1), and a second terminal coupled to the second terminal of the driving transistor Td(1, 1). The alignment transistor Ta(1, 1) may include a control terminal for receiving the voltage signal Vg1, a first terminal coupled to the electrode E1 (1, 1), and a second terminal for receiving the alignment voltage Va1. Each electronic unit D(1, 1) may include a first terminal coupled to the electrode E1(1, 1), and a second terminal coupled to the electrode E2(1, 1). The signal Sdt1, the signal Ssel1, the signal Vini1, the voltage signal Vg1 and the alignment voltage Va1 can be provided by the control chip 10. The voltage VDD can be power supply voltage, such as 3V. The alignment transistor Ta(1, 1), switching transistor Tsw(1, 1), driving transistor Td(1, 1) and reset transistor Tr(1, 1) can be thin film transistors (TFTs) or MOSFETs. The semiconductor of which can be either N-type or P-type. The control terminal, the first terminal and the second terminal of the switching transistor Tsw(1, 1) may correspond to the gate Gsw, the drain region Dsw and the source region Ssw respectively. The control terminal, the first terminal and the second terminal of the driving transistor Td(1, 1) may correspond to the gate Gd, the drain region Dd and the source region Sd respectively. The control terminal, the first terminal and the second terminal of the alignment transistor Ta(1, 1) may correspond to the gate electrode Ga, the drain electrode region Da and the source electrode region Sa respectively. During the alignment mode of electronic units D(1, 1), the external control circuit simultaneously provides the voltage signal Vg1 and the alignment voltage Va1 to turn on the alignment transistor Ta(1, 1) to generate the electric field between the electrodes E1 (1, 1) and the electrode E2(1, 1). The waveforms of the voltage signal Vg1 and the alignment voltage Va1 are illustrated in FIG. 2. The details are not repeated here for the sake of brevity.

During the operating mode of the electronic units D(1, 1), the control chip 10 can set the signal Ssel1 to high voltage level to turn on the switching transistor Tsw(1, 1), and set the signal Sdt1 to high voltage level to charge the capacitor C(1, 1) and to turn on the driving transistor Td(1, 1) through the switching transistor Tsw(1, 1), thereby turning on the electronic units D(1, 1). In addition, the control chip 10 can set the voltage signal Vg1 to the voltage level VgL to turn off the alignment transistor Ta(1, 1), and set the signal Sr1 to low voltage level to turn off the reset transistor Tr(1, 1). During the non-operating mode of the electronic units D(1, 1), the control chip 10 can set the signal Ssel1 to low voltage level to turn off the switching transistor Tsw(1, 1), and set the signal Sr1 to high voltage level to discharge the capacitor C(1, 1) and turn off the driving transistor Td(1, 1), thus turning off the electronic units D(1, 1). In addition, the control chip 10 can set the voltage signal Vg1 to the voltage level VgL to turn off the alignment transistor Ta(1, 1). The high voltage level can exceed the threshold voltage of the switching transistor Tsw(1, 1), the threshold voltage of the driving transistor Td(1, 1) and the threshold voltage of the reset transistor Tr(1, 1). For example, the high voltage level can be 3V. The low voltage level can be lower than the threshold voltage of the switching transistor Tsw(1, 1), the threshold voltage of the driving transistor Td(1, 1) and the threshold voltage of the reset transistor Tr(1, 1). For example, the low voltage level can be 0V.

Figure 5:
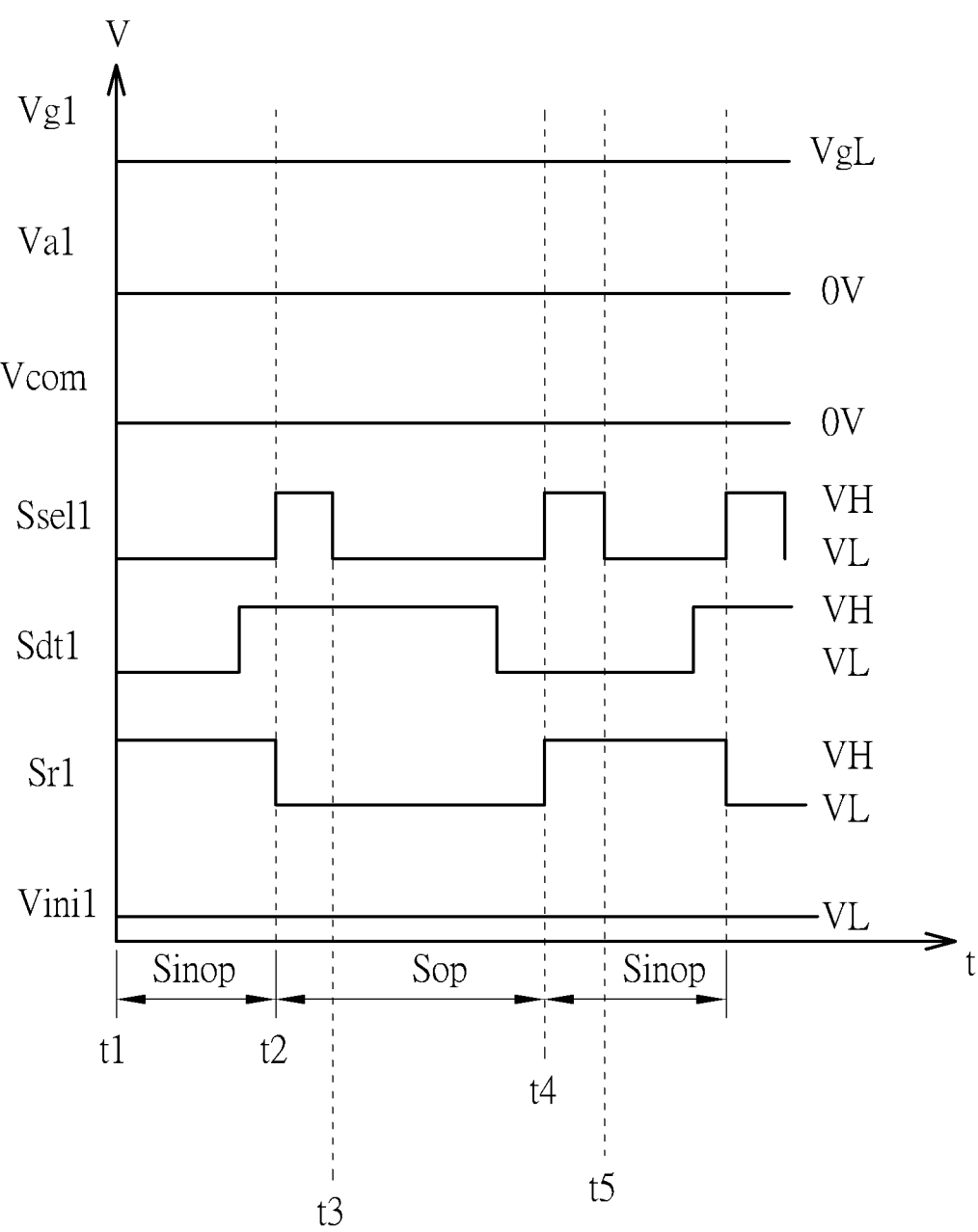
FIG. 5 illustrates the waveforms of a pixel in FIG. 1 in non-operating mode and operating mode.

FIG. 5 illustrates the waveforms of the pixel P(1, 1) in the non-operation mode Sinop and the operation mode Sop. The horizontal axis represents time t, and the vertical axis represents voltage V. Between time t1 and time t2, the voltage signal Vg1 is set to the voltage level VgL. The alignment voltage Va1 is set to 0V or floating. The common voltage Vcom is set to 0V or a voltage lower than VDD. The signal Ssel1 is set to the low voltage level VL. The signal Sr1 is set to the high voltage level VH. As the result, the alignment transistor Ta(1, 1) is turned off; the switching transistor Tsw(1, 1) is turned off; the reset transistor Tr(1, 1) is turned on; the drive transistor Td(1, 1) is turned off. With such operation, the electronic units D(1, 1) are set to the non-operating mode Sinop.

At time t2, the voltage signal Vg1 maintains the voltage level VgL. The alignment voltage Va1 maintains 0V or floating. The common voltage Vcom maintains 0V or a signal lower than VDD. The signal Ssel1 rises to the high voltage level VH. The signal Sdt1 is set to the high voltage level VH. The signal Sr1 is dropped to the low voltage level VL. As the result, the alignment transistor Ta(1, 1)) is turned off; the switching transistor Tsw(1, 1) is turned on; the reset transistor Tr(1, 1) is turned off; the drive transistor Td(1, 1) is turned on. With such operation, the electronic units D(1, 1) enter the operating mode Sop. At time t3, the signal Ssel1 is dropped to the low voltage level VL to turn off the switching transistor Tsw(1, 1), and the reset transistor Tr (1, 1) and the driving transistor Td (1, 1) maintain in the same state. At time t4, the voltage signal Vg1 is maintained at the voltage level VgL. The alignment voltage Va1 is maintained at 0V or floating. The common voltage Vcom is maintained at 0V or lower than VDD. The signal Ssel1 rises to the high voltage level VH. The signal Sdt1 is set to the low voltage level VL. The signal Sr1 rises to the high voltage level VH. The signal Vini1 is set to the low voltage level VL. As the result, the alignment transistor Ta(1, 1) is turned off; the switching transistor Tsw(1, 1) is turned on; the reset transistor Tr(1, 1) is turned on; the driving transistor Td(1, 1) is turned off. As such, the electronic units D(1, 1) enter the non-operating mode Sinop. During time t2 to t4, the electronic units D(1, 1) may be in an operating mode. At time t5, the signal Ssel1 drops to the low voltage level VL, and the transistors operate in the same manner as that during time t1 to t2.

The electronic units D(1, 1) can repeatedly switch between the non-operating mode Sinop and the operating mode Sop in order to display images. Since the alignment transistor Ta(1, 1) is continuously turned off, the non-operating mode Sinop and the operating mode Sop of the electronic units D(1, 1) are not be affected by the alignment voltage Va1. Also, since the alignment voltage Va1 is set to 0V, the influence of the leakage current on the non-operation mode Sinop and the operation mode Sop of the electronic units D(1, 1) can be further reduced.

Figure 6:
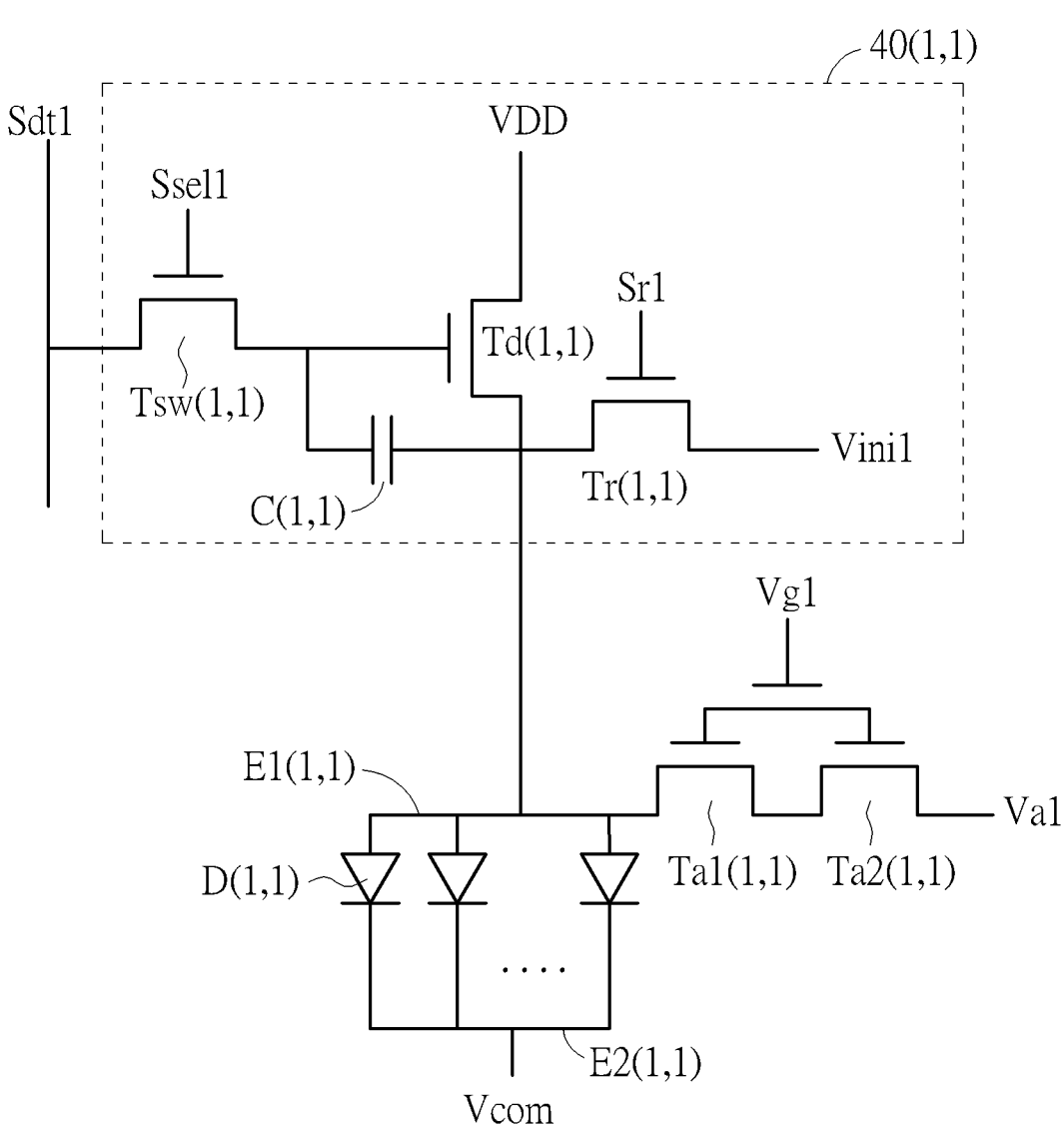
FIG. 6 is a circuit diagram of another pixel in FIG. 1.

In some embodiments, in order to further reduce the leakage current from the alignment transistor Ta(1, 1) being not able to completely turned off due to component defects, the pixel P(1, 1) in FIG. 4 can be cut permanently (i.e., laser cutting) at the node Ncut after completing the alignment process. Cutting off the alignment transistor Ta(1, 1) can eliminate its leakage current completely. The node Ncut is not limited to the position shown in FIG. 4, but can be any insulating point between the electrode E1 (1, 1) and the alignment transistor Ta (1, 1). In other embodiments, the alignment transistor Ta(1, 1) can also be replaced by two or more alignment transistors coupled in cascode in order to further reduce or block the leakage current. For example, FIG. 6 is a circuit diagram of another pixel P(1, 1). The pixel P(1, 1) includes two alignment transistors Ta1 (1, 1) and Ta2 (1, 1) coupled in cascode. The alignment transistors Ta1(1, 1) and Ta2(1, 1) in FIG. 6 replace the function of the alignment transistor Ta(1, 1) in FIG. 4. The main difference between the embodiment of FIG. 6 and FIG. 4 lies in the alignment transistor Ta1(1, 1) and the alignment transistor Ta2(1, 1). The setting and operation of other components in FIG. 6 are similar to those in FIG. 4. The details are not repeated here for the sake of brevity. The alignment transistor Ta1(1, 1) and the alignment transistor Ta2(1, 1) are explained in detail below.

The alignment transistor Ta1 (1, 1) includes a control terminal for receiving the voltage signal Vg1, a first terminal coupled to the electrode E1(1, 1), and a second terminal. The alignment transistor Ta2(1, 1) includes a control terminal coupled to the control terminal of the alignment transistor Ta1(1, 1), and a first terminal coupled to the second terminal of the alignment transistor Ta1 (1, 1), and a second terminal for receiving the alignment voltage Va1. In the non-operating mode and the operating mode of the electronic units D(1, 1), the control chip 10 can set the voltage signal Vg1 to the voltage level VgL to turn off the alignment transistor Ta1(1, 1) and the alignment transistor Ta2(1, 1). With two alignment transistors Ta1(1, 1) and Ta2(1, 1), the leakage current can be further reduced or blocked.

Figure 7:
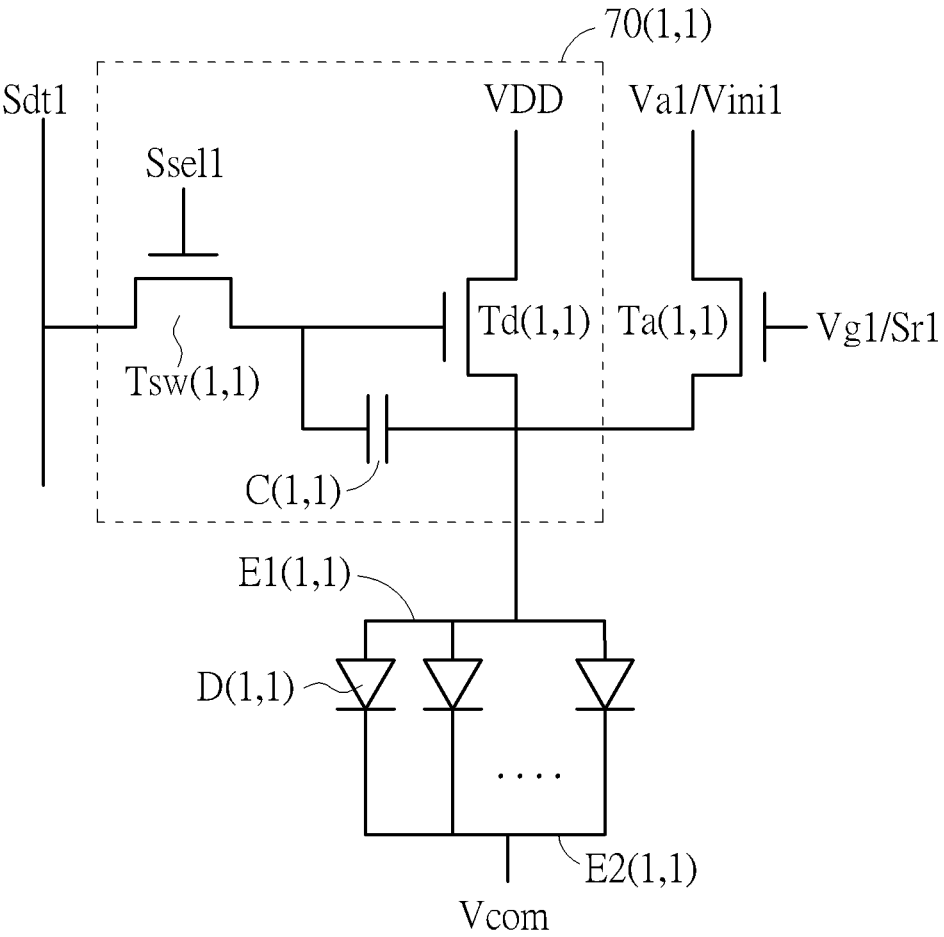
FIG. 7 is a circuit diagram of another pixel in FIG. 1.

FIG. 7 is a circuit diagram of another pixel P(1, 1). The main difference between FIG. 7 and FIG. 4 is that the pixel P(1, 1) in FIG. 7 uses the alignment transistor Ta2 (1, 1) for alignment and reset, so the embodiment does not need to configure the reset transistor Tr(1, 1). The arrangement and operation of other components in FIG. 7 are similar to those in FIG. 4, and the details are not repeated here for the sake of brevity. The following explains the operation of the alignment transistor Ta (1, 1) in FIG. 7 in detail.

Figure 8:
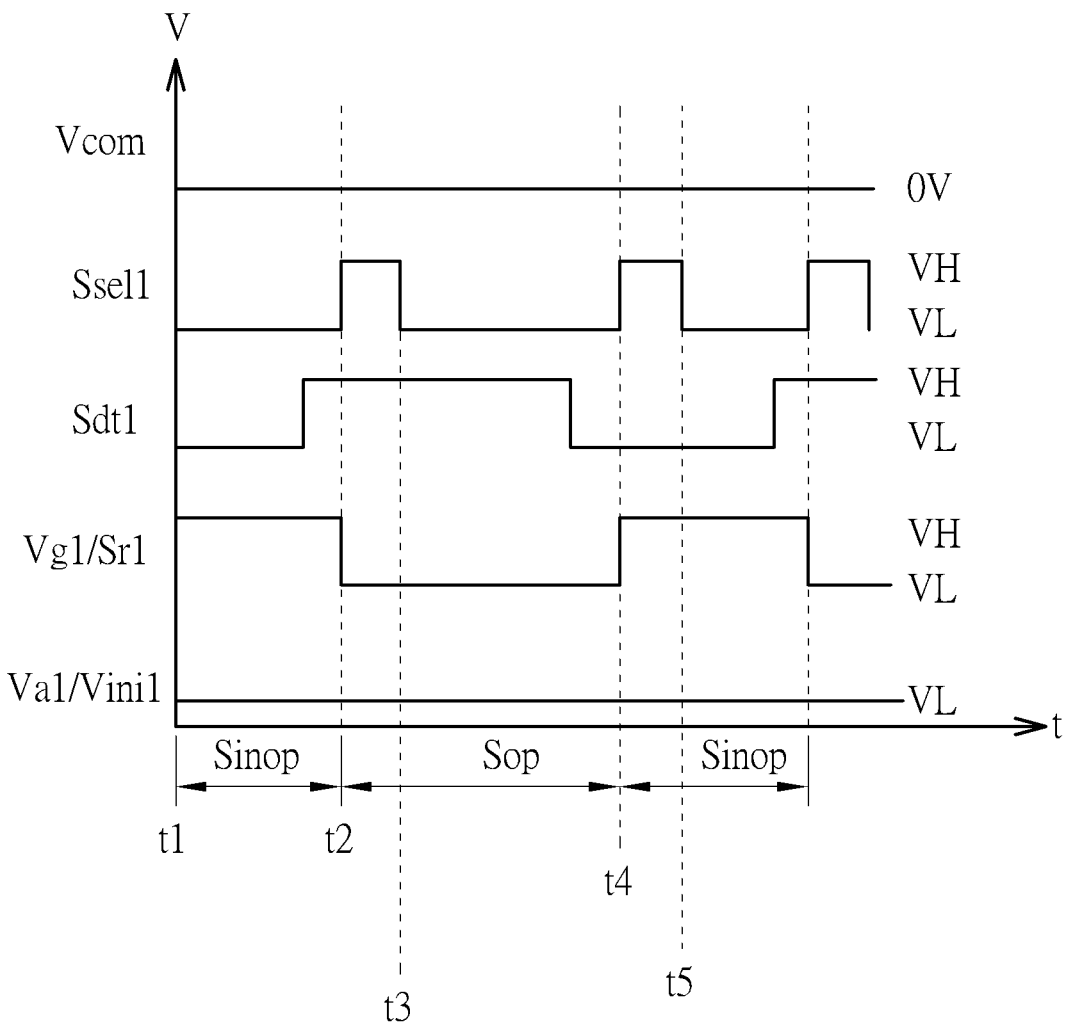
FIG. 8 illustrates the waveform of the pixel in FIG. 7 in non-operating mode and operating mode.

The alignment transistor Ta(1, 1) in FIG. 7 includes a control terminal for receiving the voltage signal Vg1 or signal Sr1, a first terminal coupled to the electrode E1(1, 1), and a second terminal for receiving the alignment voltage Va1 or signal Vini1. During the alignment mode of the electronic units D(1, 1), the external control circuit can simultaneously provide the voltage signal Vg1 and the alignment voltage Va1 to turn on the alignment transistor Ta(1, 1). As the result, the electric field is generated between the electrodes E1(1, 1) and the electrodes E2(1, 1). The waveforms of the voltage signal Vg1 and the alignment voltage Va1 are illustrated in FIG. 2; the details are not repeated here for the sake of brevity. In the non-operating mode and the operating mode of the electronic units D(1, 1), the control chip 10 can output the signal Sr1 to the control terminal of the alignment transistor Ta(1, 1) and the signal Vini1 to the second terminal of the alignment transistor Ta(1, 1). The waveforms of the voltage signal Sr1 and the voltage signal Vini1 are illustrated in FIG. 8. FIG. 8 illustrates the operation waveforms of the pixel P(1, 1) in FIG. 7 in the non-operating mode Sinop and the operating mode Sop. The horizontal axis represents time t, and the vertical axis represents voltage V. The timings of the common voltage Vcom, the signal Ssel1, and the signal Sdt1 in FIG. 8 and FIG. 5 are the same; the timings of the signal Vg1/Sr1 and the signal Va1/Vini1 in FIG. 8 are the same as that of the signal Sr1 and the signal Vini1 in FIG. 5. The details are not repeated here for the sake of brevity. Since the alignment transistor Ta(1, 1) can be used to align and reset the electronic units D(1, 1), the pixel P(1, 1) in FIG. 7 does not need an additional reset transistor Tr(1, 1). As such, the embodiment can achieve the effect of reducing circuit area and manufacturing cost.

Figure 9:
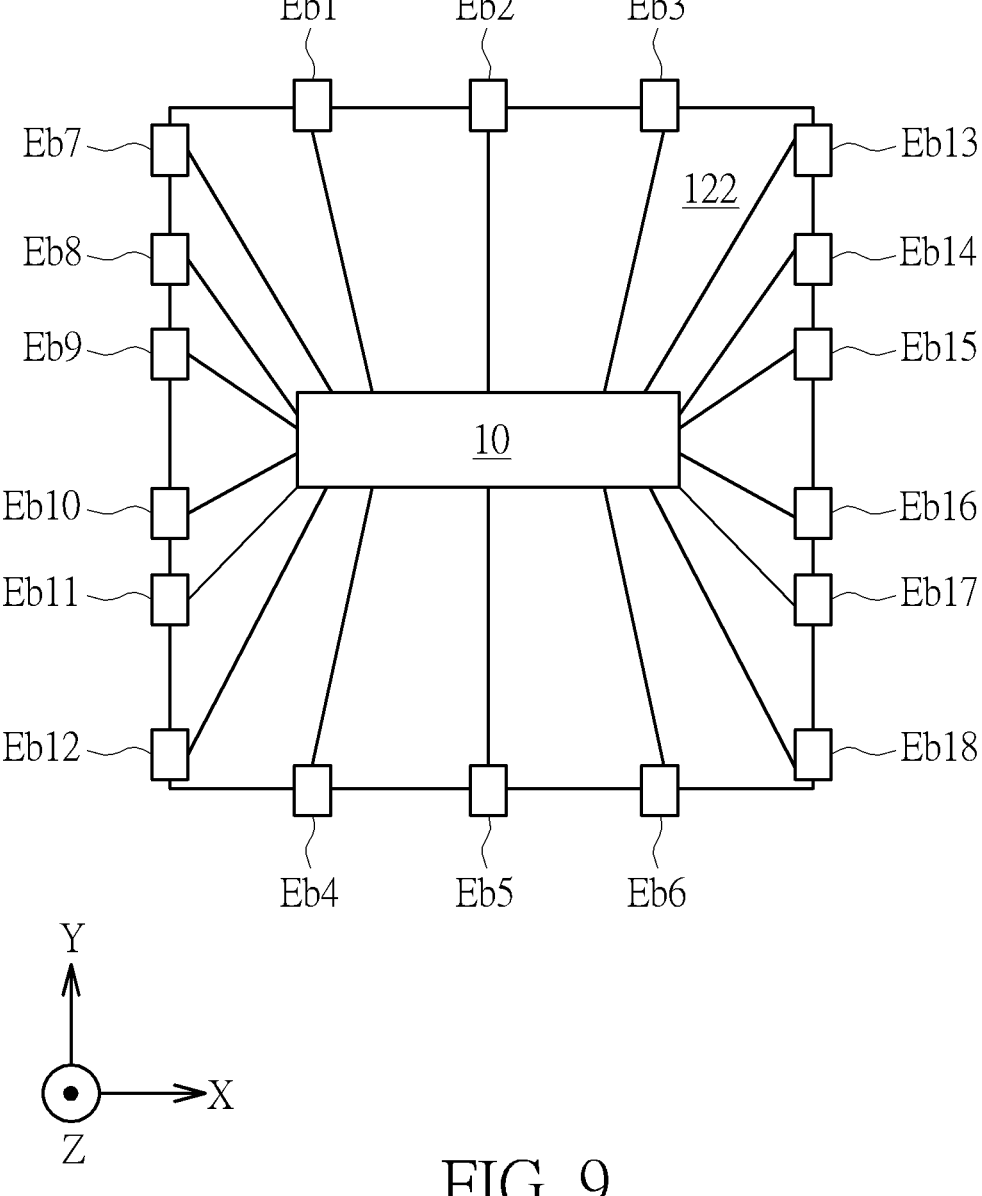
FIG. 9 is a diagram of the back surface of the electronic device in FIG. 1.

FIG. 9 is a diagram of the back surface of another electronic device 9. The front surface of the electronic device 9 is similar to that of the electronic device 1 in FIG. 1, but the control chip 10 and the bonding electrodes Eb1-Eb18 of the electronic device 9 are disposed on the back surface 122 of the substrate 12 instead of the front surface 121. The control chip 10 can be coupled to the bonding electrodes Eb1-Eb9 and Eb10-Eb18, and the bonding electrodes can receive the various signals mentioned above (i.e., the common voltage Vcom, the signal Ssel1, and the signal Sdt1). Especially, the signals Vg1 or Sr1 mentioned above are also generated by the control chip on the back surface, and the signals are sent to the front surface via the bonding electrodes.

Figure 10:
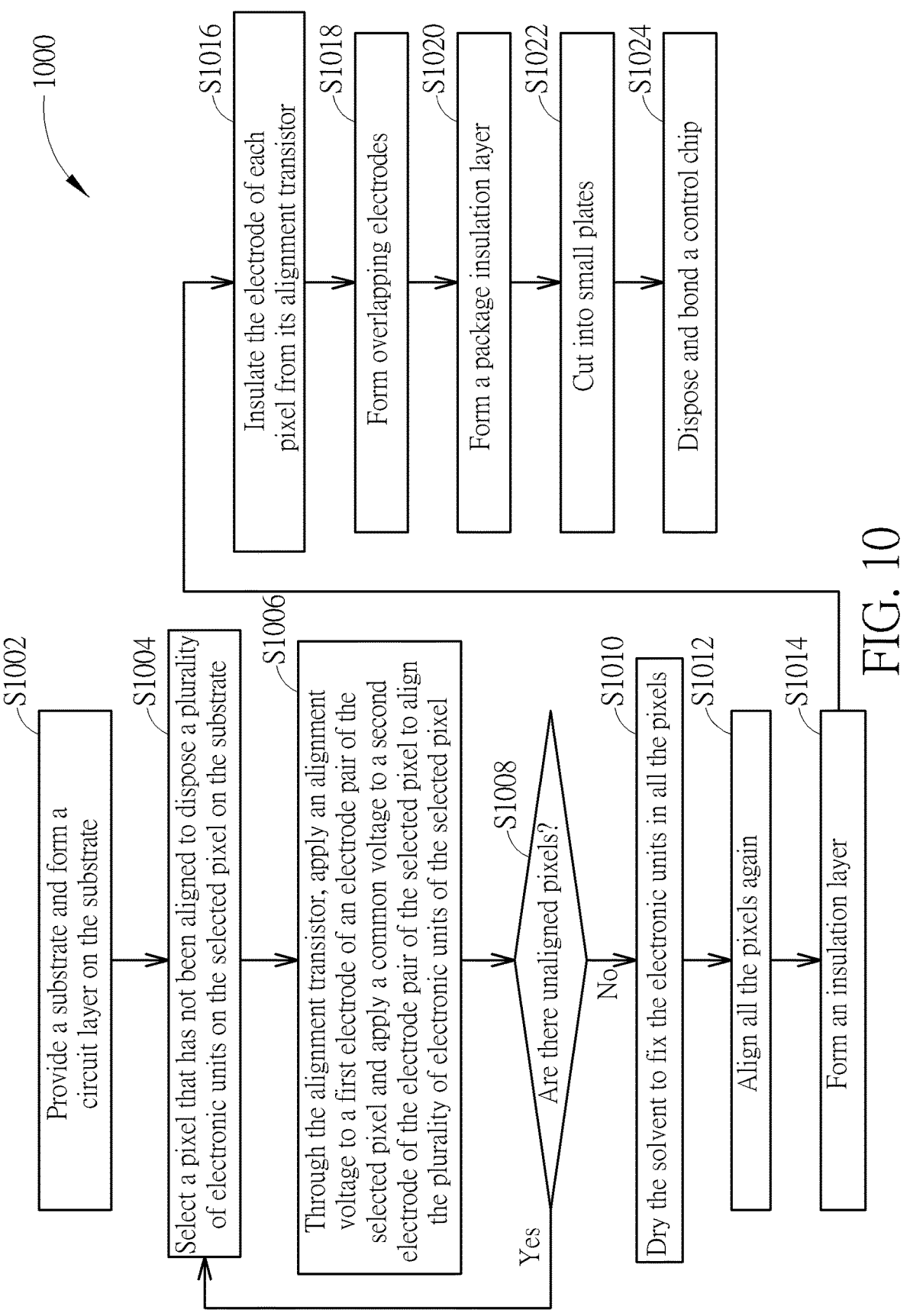
FIG. 10 is a flowchart of the fabrication method of the electronic device in FIG. 1.

FIG. 10 is a flowchart of a fabrication method 1000 of the electronic device 1 or the electronic device 9. The fabrication method of the electronic device 1 or 9 includes steps S1002 to S1024. Any reasonable adjustment of steps and sequences is within the scope of the present disclosure. Steps S1002 to S1024 are illustratively explained as follows:

Step S1002: Provide a substrate 12 and form a circuit layer on the substrate 12;

Step S1004: Select a pixel that has not been aligned to dispose a plurality of electronic units on the selected pixel on the substrate 12;

Step S1006: Through the alignment transistor, apply an alignment voltage to a first electrode of an electrode pair of the selected pixel and apply a common voltage Vcom to a second electrode of the electrode pair of the selected pixel to align the plurality of electronic units of the selected pixel;

Step S1008: Determine whether there are unaligned pixels? If so, return to step S1004; if not, continue to step S1010;

Step S1010: Dry the solvent to fix the electronic units in all the pixels;

Step S1012: Align all the pixels again;

Step S1014: Form an insulation layer;

Step S1016: Insulate the electrode of each pixel from its alignment transistor;

Step S1018: Form overlapping electrodes;

Step S1020: Form a package insulation layer;

Step S1022: Cut into small plates;

Step S1024: Dispose and bond a control chip.

FIGS. 11-16 are diagrams illustrating the steps of the fabrication method 1000. The fabrication method 1000 is explained below with reference to FIG. 1, and FIGS. 11-16. Referring to FIG. 1, in step S1002, a circuit layer is formed on the substrate 12, and each pixel includes the alignment transistor and the electrode pair. For example, the pixel P(1, 1) includes an alignment transistor Ta(1, 1), electrode E1(1, 1) and electrode E2(1, 1); the pixel P(1, 2) includes an alignment transistor Ta (1, 2), electrode E1 (1, 2) and electrode E2 (1, 2).

Figure 11:
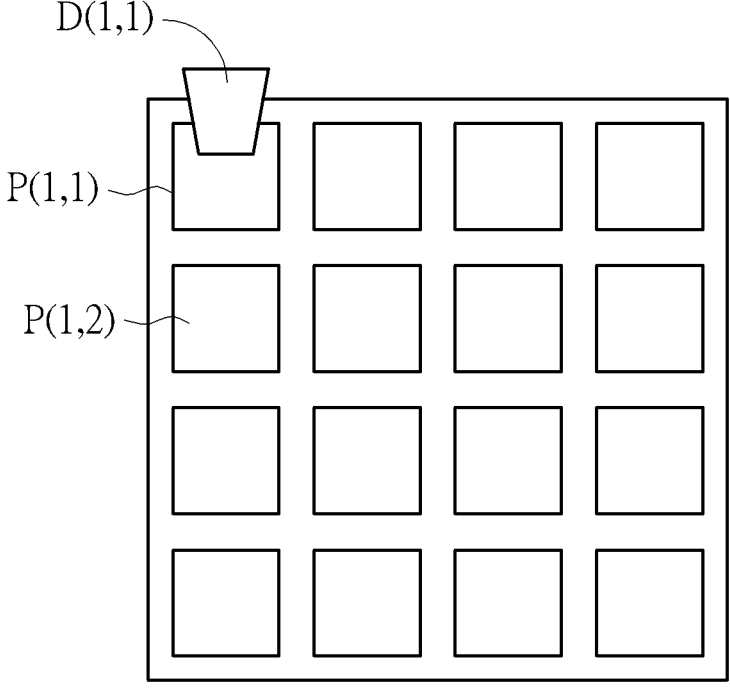
FIGS. 11-16 are diagrams illustrating the steps of the fabrication method of the electronic devices in FIGS. 1 and 9.
Figure 11:
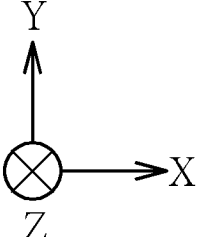

In some embodiments, all alignment transistors can be controlled to align each pixel sequentially, so that the alignment of each pixel is not disturbed by the electric field of adjacent pixels. Referring to FIG. 11, in step S1004, all pixels have not yet been aligned. The pixel P(1, 1) is selected and the solvent with a plurality of electronic units D(1, 1) is dropped into the pixel P(1, 1). Then in step S1006, the external control circuit applies the voltage signal Vg1 to turn on the alignment transistor Ta (1, 1), and applies an alignment voltage through the alignment transistor Ta(1, 1) of the pixel P(1, 1). The signal Va1 is sent to the electrode E1(1, 1) of the pixel P(1, 1), and the common voltage Vcom is applied to the electrode E2(1, 1) of the pixel P(1, 1). Thus, the electronic units D(1, 1) are controlled by the electric fields for alignment. In some embodiments, the external control circuit can control the alignment transistors of pixels other than the pixel P(1, 1), so that other pixels do not generate electric fields, which reduces interference of the electric field from neighboring pixels during the alignment process.

In step S1008, when there are still unaligned pixels on the substrate 12, the process flow returns to step S1004. For example, in step S1004, the pixel P(1, 2) is selected from the pixels that have not yet been aligned, and the solvent with the electronic units D(1, 2) is dropped into the pixel P(1, 2). Then in step S1006, the voltage signal Vg1 is applied to turn on the alignment transistor Ta(1, 2), and the alignment voltage Va2 is applied to the pixel P(1, 2) through the alignment transistor Ta(1,2) of the pixel P(1, 2). The common voltage Vcom is applied to the electrode E2 (1, 2) of the pixel P(1, 2). As such, the electronic units D(1, 2) can be properly aligned. the external control circuit can control the alignment transistors of pixels other than the pixel P(1, 2), so that other pixels do not generate electric fields, which reduces interference of the electric field from neighboring pixels during the alignment process. Then in step S1008 again, if there are still unaligned pixels on the substrate 12, the iteration of steps S1004 to S1008 is repeated until all pixels on the substrate 12 are properly aligned.

In some embodiments, the sequence of step S1004 and step S1006 can be adjusted. For example, before the solvent with the electronic units D(1, 1) is dropped into the pixel P(1, 1) on the substrate 12, the voltage signal Vg1 can be applied to turn on the alignment transistor Ta(1, 1), and the alignment voltage Va1 can be applied to the alignment transistor Ta(1, 1) to generate the electric field between the electrode E1(1, 1) and the electrode E2(1, 1) before dropping the solvent. Such adjustment in the fabrication steps can improve the alignment dimension of the electronic units D(1, 1).

Figure 12:
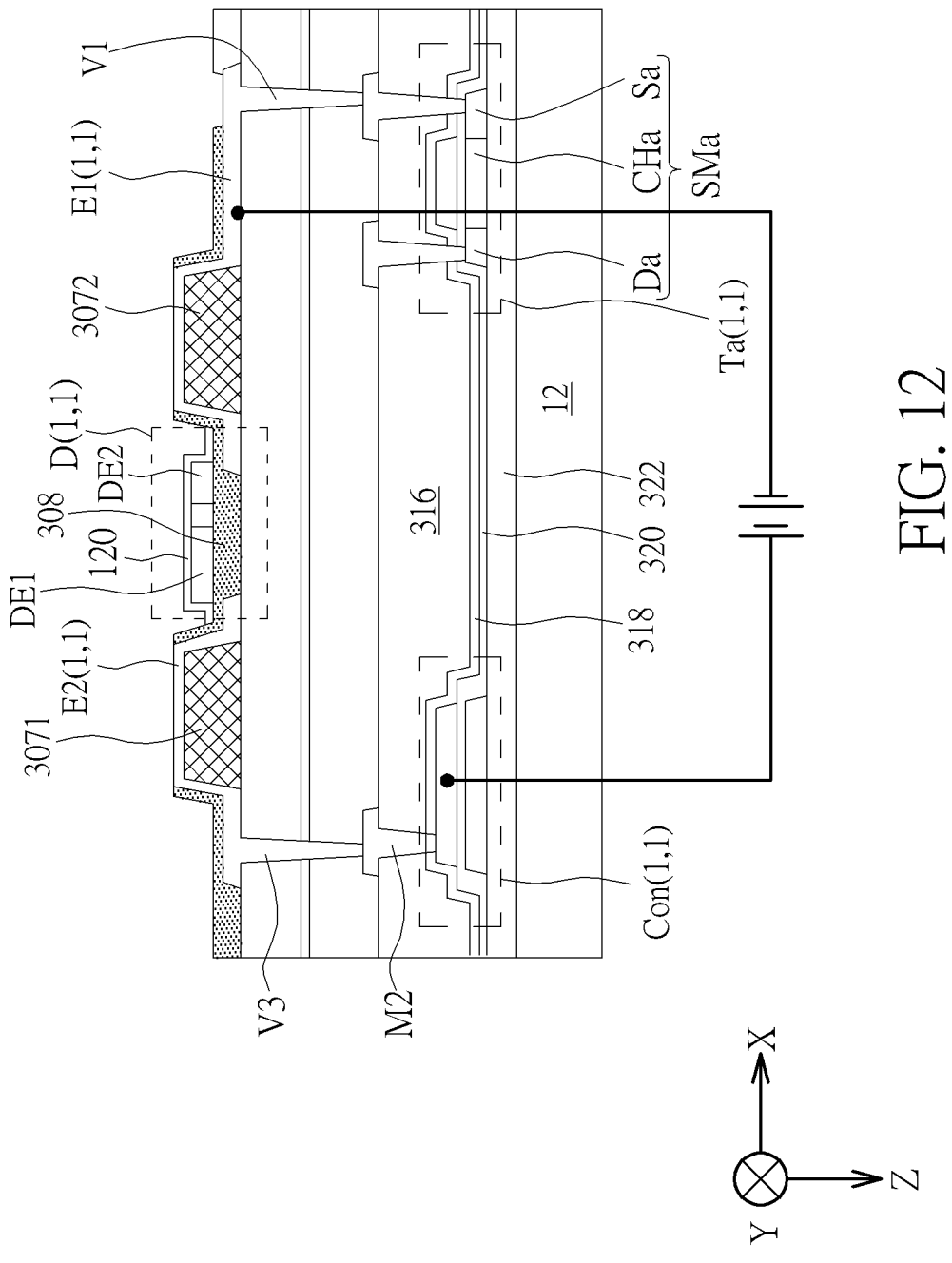
Figure 13:
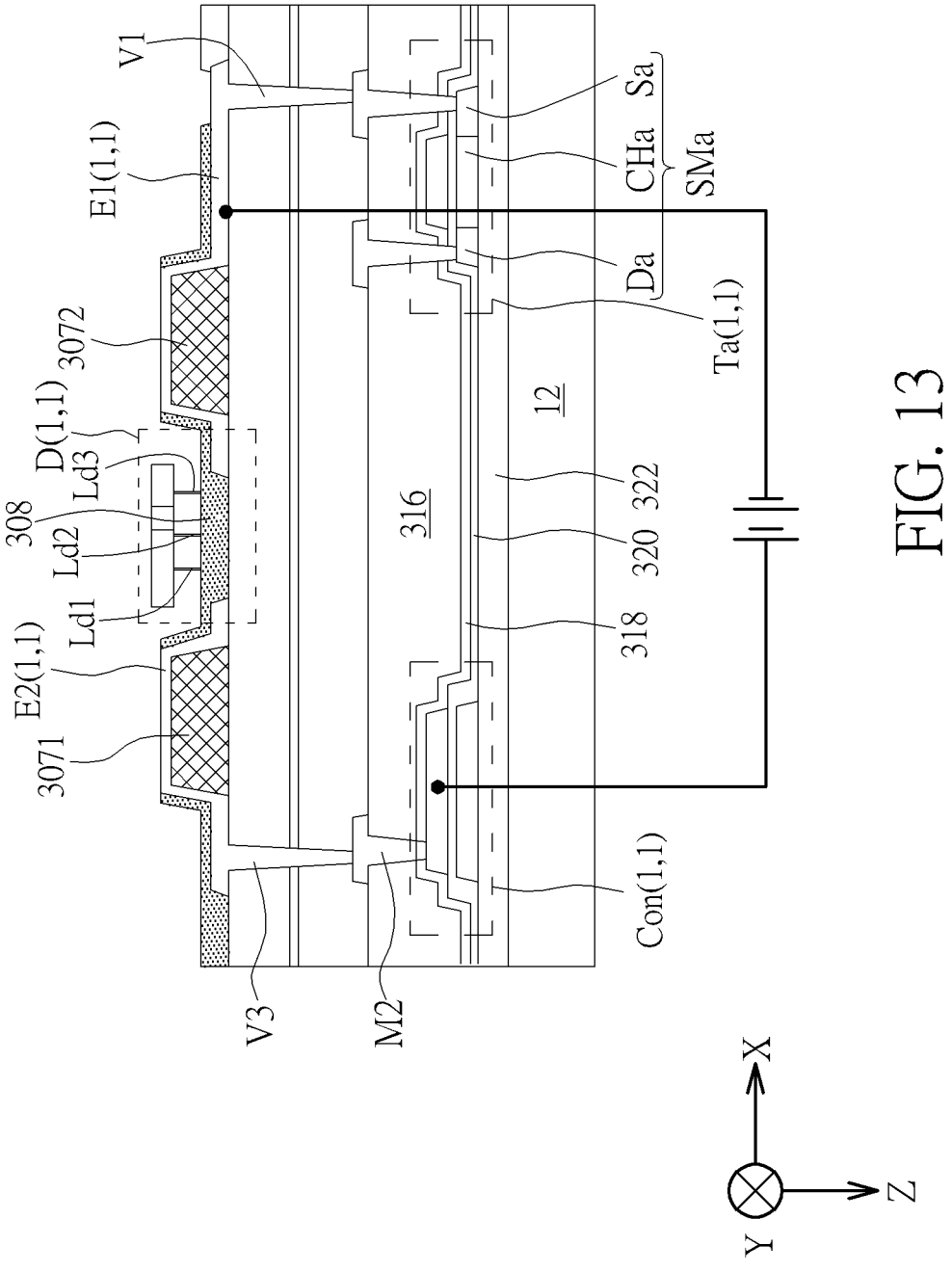

After all pixels on the substrate 12 have been aligned, in step S1010, the solvent used to transfer the electronic units may be heated dry to substantially attach the electronic units in all pixels. Step S1010 is an optional step. The solvent may include acetone, water, alcohol, toluene, ethanol, ether, dichloromethane and/or other organic solvents. In some embodiments, electricity can passed through an electrode pair of each pixel to heat up the solvent to a predetermined temperature, for example, between 35° C. and 85° C. The temperature can volatilize the solvent. In some embodiments, the solvent may further include polymers. After heating dry the solvent, the polymers can form a polymer film to attach the electronic units. FIG. 12 shows that the polymer film 120 at least partially covers the electronic units D(1, 1). In other embodiments, ligands can be formed around the electronic units (i.e., upper surface or lower surface). After drying the solvent, the ligands on the surface of the electronic units and the ligands in the opening between the pixel defining layer 3071 and 3072 are cross-linked to attach the electronic units. FIG. 13 shows that the electronic units D(1, 1) are attached in the opening between the pixel defining layers 3071 and 3072 via the crosslinked ligands Ld1, LD2 and Ld3.

Figure 14:
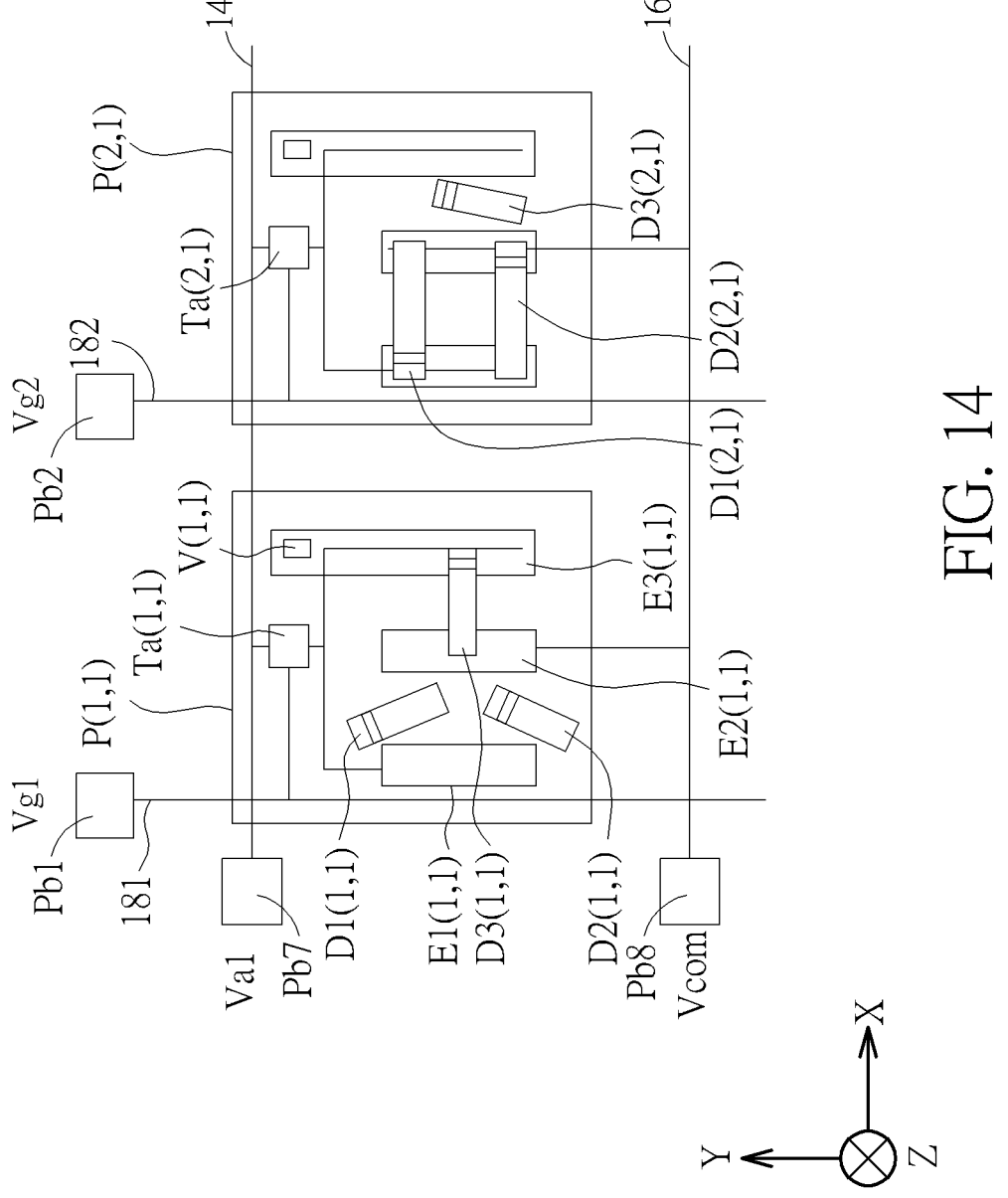

In step S1012, due to misalignment of the electronic units in the pixel, when the solvent is dried, all alignment transistors are turned on for alignment again. Step S1012 is an optional step. Referring to FIG. 14, the electronic unit D1 (1, 1) and the electronic unit D2(1, 1) of the pixel P(1, 1) are misaligned. The electronic unit D3(1, 1) is properly aligned. The electronic unit D3(2, 1) of the pixel P(2, 1) is dislocated. The electronic unit D1(2, 1) and electronic unit D2 (2, 1) are properly aligned. As such, the alignment transistor Ta(1, 1) and the alignment transistor Ta(2, 1) can be turned on at the same time. The alignment transistor Ta(2, 1) is used to re-align all the electronic units D1 (1, 1)-D3 (1, 1) and electronic units D1(2, 1)-D3(2, 1). In some embodiments, the alignment transistors are continuously provided with the alignment voltage for an extended time, and the alignment process is enhanced by extending the alignment time. For example, referring to FIG. 14, the alignment transistor Ta(1, 1) and the alignment transistor Ta(2, 1) can be simultaneously turned on and receive the alignment voltage Va1 for an extended period of time, thereby enhancing the alignment process for the electronic unit D1(1, 1)-D3(1, 1) and D1(2, 1)-D3(2, 1). The extended period of time may exceed the time period between time t1 and time t2 in FIG. 2. In some other embodiments, the alignment voltage is increased. In other words, the time period for the alignment process remains the same, and the voltage amplitude is increased from +/−30V to +/−50V, thereby enhancing the alignment process. For example, referring to FIG. 14, the alignment transistor Ta(1, 1) and the alignment transistor Ta(2, 1) can be simultaneously turned on and receive the alignment voltage Va1 oscillating between 50V and −50V. It enhances the alignment process for the electronic units D1(1, 1)-D3(1, 1) and D1(2, 1)-D3(2, 1).

Figure 15:
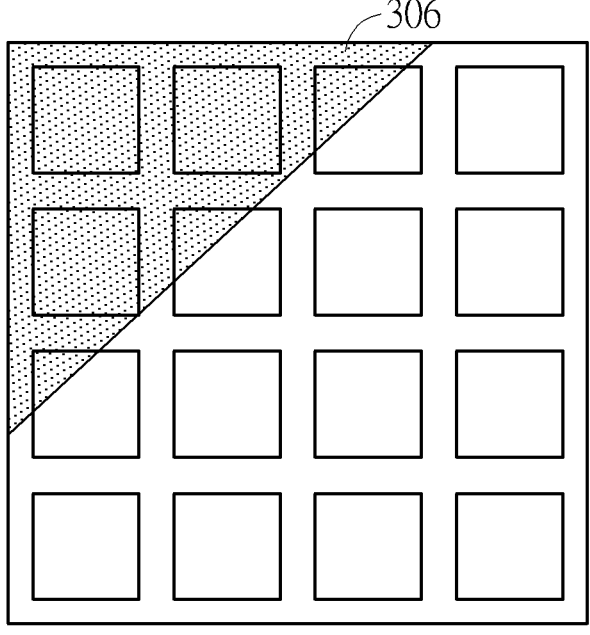
Figure 15:
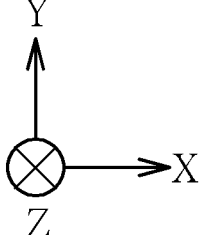

In step S1014, when forming the insulation layers, the alignment transistors can be turned on to generate the electric field continuously such that the alignment of the electronic units in each pixel would not be affected by the process. FIG. 15 shows that when forming the insulation layers, the alignment transistors can be turned on to generate the electric field continuously. The insulation layer 306 may be, for example, perfluoroalkoxy resin. After the insulation layer 306 is formed on top, patterning can be performed to produce the structure shown in FIG. 3. In step S1016, the alignment transistors of all pixels are turned off such that the electrodes of all pixels from their alignment transistors are insulated. In some embodiments, laser cutting may also be performed on each pixel to cut off the alignment transistors from the electrodes.

In step S1018, the bonding electrodes of each electronic device are formed. The bonding electrodes and their positions can be located on the front surface or the back surface of the substrate 12. For example, in FIG. 9, the bonding electrodes Eb1-Eb18 may be formed on the back surface 122 of the substrate 12.

Figure 16:
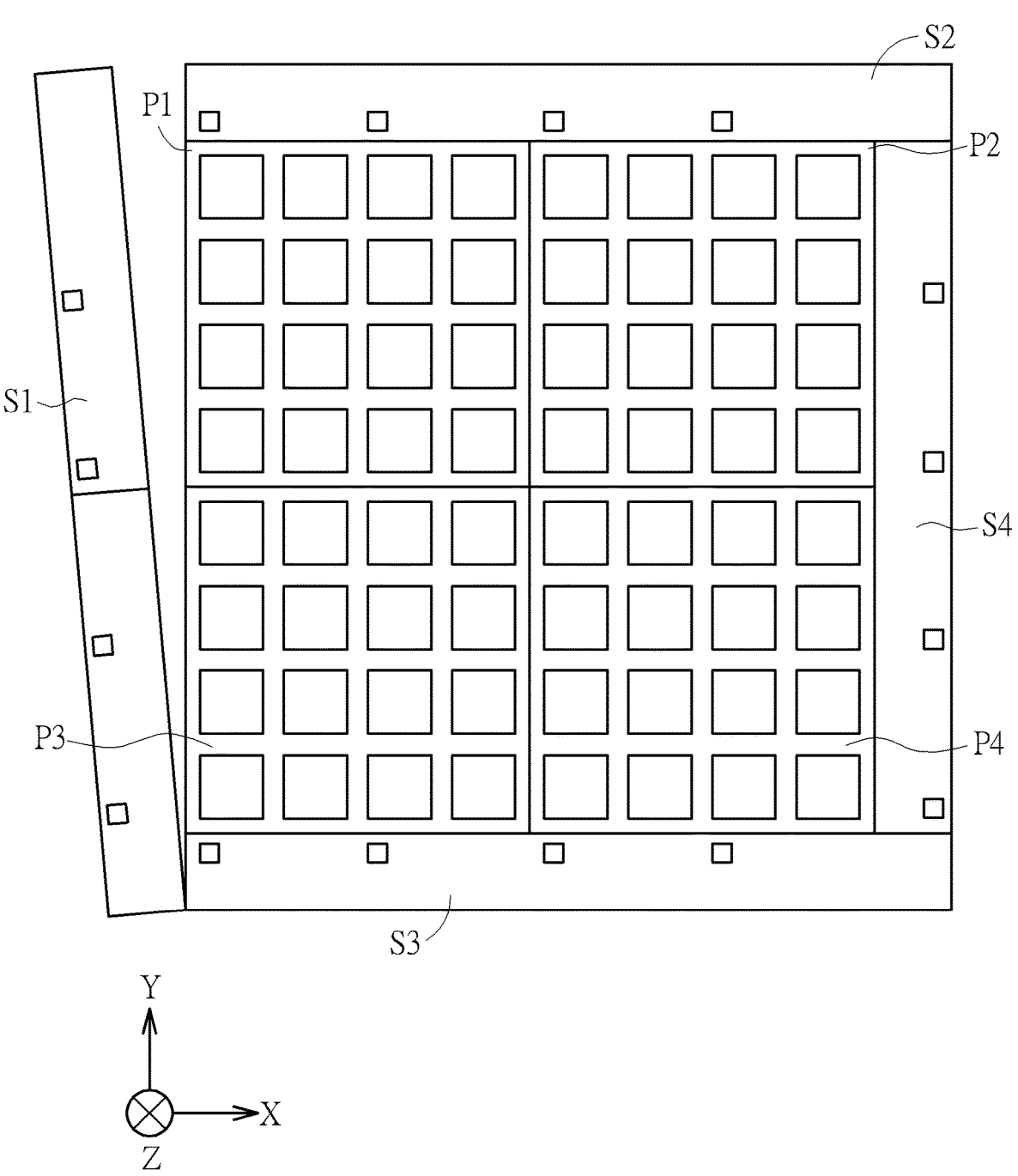

In step S1020, an insulation packaging layer is formed on the plurality of electronic devices on the substrate 12. In step S1022, the edge portions of the substrate 12 are cut off, and then the substrate 12 with the pixels is cut into small plates of predetermined size. Referring to FIG. 16, the edge portions S1, S2, S3 and S4 of the substrate 12 are cut off first, and then the substrate 12 with the pixels is cut into small plates P1-P4, and each small plate can be made into a separate electronic device. In step S1024, the control chips are disposed at the predetermined position on the substrate 12 of the small plates P1-P4. And then, the control chips are bonded to the bonding electrodes of the corresponding electronic devices. For example, in FIG. 9, the control chip 10 may be disposed on the back surface 122 of the substrate 12 and bonded to the bonding electrodes Eb1-Eb6.

The electronic device and its fabrication method provided by the various embodiments use independent alignment electrodes and independent alignment transistors for each pixel. Through using fluid transfer or inkjet transfer technology in conjunction with the disclosed method, each pixel can be aligned independently during the alignment process to ensure normal functioning of the electronic device and reducing display abnormalities.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device comprising:
a substrate;
a first transistor disposed on the substrate;
a second transistor disposed on the substrate;
a first electrode disposed on the substrate and coupled to the first transistor;
a second electrode disposed on the substrate and coupled to the second transistor; and
a plurality of first electronic units disposed on the substrate and coupled to the first electrode and the second electrode;
wherein the first transistor is used to align the plurality of first electronic units when the plurality of first electronic units are in an alignment mode, and the first transistor is turned off and the second transistor is turned on to drive the plurality of first electronic units when the plurality of first electronic units are in an operating mode.

2. The electronic device of claim 1 wherein the first transistor comprises an oxide semiconductor.

3. The electronic device of claim 1 further comprising a second transistor coupled to the first transistor in cascode, the second transistor comprising a control terminal coupled to a control terminal of the first transistor.

4. The electronic device of claim 1, wherein the plurality of first electronic units comprise a plurality of light emitting units.

5. The electronic device of claim 4, wherein the plurality of light emitting units are rod-shaped light emitting units.

6. A method of fabricating an electronic device comprising:
providing a substrate;
forming a first transistor on the substrate;
forming a first electrode pair on the substrate, wherein a first electrode of the first electrode pair is coupled to the first transistor;
disposing a plurality of first electronic units on the substrate;
aligning the plurality of first electronic units by applying a first voltage to the first electrode and applying a second voltage to a second electrode of the first electrode pair through the first transistor; and
insulating the first electrode from the first transistor after aligning the plurality of first electronic units.

7. The method of claim 6 further comprising applying the first voltage to the first transistor before disposing the plurality of first electronic units on the substrate.

8. The method of claim 6 further comprising:
forming a second transistor on the substrate;
forming a second electrode pair, wherein a first electrode of the second electrode pair is coupled to the second transistor;
disposing a plurality of second electronic units on the substrate; and
after aligning the plurality of first electronic units, aligning the plurality of second electronic units by applying a third voltage to the first electrode of the second electrode pair through the second transistor and applying a fourth voltage to a second electrode of the second electrode pair.

9. The method of claim 8 further comprising:

applying a fifth voltage to the first electrode of the first electrode pair through the first transistor and applying the fifth voltage to the first electrode of the second electrode pair through the second transistor; and forming an insulation layer on the plurality of first electronic units and the plurality of second electronic units.

\* \* \* \* \*